US009877414B2

(12) United States Patent
Vorreiter

(10) Patent No.: US 9,877,414 B2
(45) Date of Patent: Jan. 23, 2018

(54) CONFIGURABLE TELECOMMUNICATION EQUIPMENT CHASSIS

(71) Applicant: Infinera Corp., Annapolis Junction, MD (US)

(72) Inventor: Loren Vorreiter, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 14/515,335

(22) Filed: Oct. 15, 2014

(65) Prior Publication Data

US 2016/0113156 A1 Apr. 21, 2016

(51) Int. Cl.
H05K 7/20 (2006.01)
H05K 7/14 (2006.01)

(52) U.S. Cl.
CPC ....... H05K 7/20581 (2013.01); H05K 7/1492 (2013.01); H05K 7/20145 (2013.01)

(58) Field of Classification Search
CPC ........... H05K 7/20736; H05K 7/20581; H05K 7/2051; H05K 7/1492
USPC ....... 361/679.01–679.045, 679.055–679.061, 361/692, 724–727
See application file for complete search history.

(56) References Cited

U.S. PATENT DOCUMENTS

| | | | | | |
|---|---|---|---|---|---|
| 5,175,670 | A | * | 12/1992 | Wang | G06F 1/183 361/679.33 |
| 5,460,441 | A | * | 10/1995 | Hastings | G06F 1/184 312/138.1 |
| 5,600,538 | A | * | 2/1997 | Xanthopoulos | G06F 1/181 361/679.46 |
| 5,698,818 | A | * | 12/1997 | Brench | H05K 9/0041 174/383 |
| 5,754,396 | A | * | 5/1998 | Felcman | G06F 1/18 361/679.6 |
| 6,002,586 | A | * | 12/1999 | Chen | G06F 1/20 174/16.1 |
| 6,504,717 | B1 | * | 1/2003 | Heard | H05K 7/2019 165/104.33 |
| 6,538,881 | B1 | * | 3/2003 | Jeakins | H05K 7/20572 165/122 |
| 6,590,768 | B1 | * | 7/2003 | Wiley | G06F 1/183 257/E23.099 |
| 6,721,183 | B1 | * | 4/2004 | Chen | G06F 1/181 16/404 |
| 6,909,603 | B2 | * | 6/2005 | Wiley | G06F 1/183 257/E23.099 |
| 7,226,353 | B2 | * | 6/2007 | Bettridge | H05K 7/20736 361/695 |

(Continued)

Primary Examiner — Robert J Hoffberg
Assistant Examiner — Matt Dhillon
(74) Attorney, Agent, or Firm — David L. Soltz

(57) ABSTRACT

The disclosure describes methods and apparatuses that are used to provide a telecommunication equipment chassis for supporting telecommunication equipment within server racks while providing an adjustable venting arrangement for the telecommunication equipment. More particularly, the disclosure describes a telecommunication equipment chassis for supporting telecommunication equipment within a server rack, which is vertically adjustable, rather than horizontally adjustable, to modify the venting arrangement for the telecommunication equipment without changing a width of the telecommunication equipment chassis.

20 Claims, 6 Drawing Sheets

(56) References Cited

U.S. PATENT DOCUMENTS

| | | | | |
|---|---|---|---|---|
| 8,614,890 | B2* | 12/2013 | Hensley | H05K 5/0021 |
| | | | | 312/223.2 |
| 8,730,671 | B2* | 5/2014 | Vanderveen | H05K 7/20736 |
| | | | | 165/104.33 |
| 9,084,375 | B2* | 7/2015 | Hughes | H05K 7/20727 |
| 2003/0156385 | A1* | 8/2003 | Askeland | G06F 1/182 |
| | | | | 361/679.51 |
| 2005/0276017 | A1* | 12/2005 | Aziz | H04Q 1/023 |
| | | | | 361/695 |
| 2007/0211439 | A1* | 9/2007 | Shimizu | H05K 7/20736 |
| | | | | 361/724 |
| 2013/0267160 | A1* | 10/2013 | Hung | H05K 7/20736 |
| | | | | 454/184 |
| 2014/0085818 | A1* | 3/2014 | Lee | H05K 5/0213 |
| | | | | 361/690 |

* cited by examiner

CONFIGURABLE TELECOMMUNICATION EQUIPMENT CHASSIS

FIELD OF THE DISCLOSURE

The disclosure generally relates to methods and apparatuses that are used to provide a telecommunication equipment chassis for supporting telecommunication equipment within server racks while providing an adjustable venting arrangement for the telecommunication equipment. More particularly the disclosure relates to a telecommunication equipment chassis for supporting telecommunication equipment within a server rack, which is vertically adjustable, rather than horizontally adjustable, to modify the venting arrangement for the telecommunication equipment without changing a width of the telecommunication equipment chassis.

BACKGROUND

Chassis are commonly used for mounting telecommunication and other electronic equipment to a server rack. Size and temperature are important factors in determining the type of server rack and accompanying chassis to deploy. Physical space must be used to store electronic equipment, and therefore maximizing space efficiency is important. Also, the reliability of the electronic equipment mounted to a server rack depends on the temperature of the room or cabinet in which the equipment is stored. The use of a chassis can affect the amount of physical space used in rack. A chassis can also affect the temperature of electronic equipment through venting mechanisms.

Various cooling systems have been deployed to control the temperature of the equipment, such as hot aisle and cold aisle strategies as well as hot aisle containment and cold aisle containment. In such hot aisle containment and cold aisle containment situations, front to rear venting is essential. In open rack situations, on the other hand, front to rear venting is not as important and side venting can be deployed. Chassis are commonly provided with side venting, and if the user needs front to rear venting only, then a baffle is implemented to redirect airflow. However, implementing a baffle requires a change to the chassis width, which can conflict with some standard rack sizes or interfere with rack mount brackets.

Therefore, there exists a need for a chassis that can be reconfigured to accommodate various venting requirements without changing the width of the chassis. It is to such an apparatus that the inventive concepts disclosed herein are directed.

BRIEF DESCRIPTION OF THE DRAWINGS

Certain embodiments of the inventive concepts will hereafter be described with reference to the accompanying drawings, wherein like reference numerals denote like elements. It should be understood, however, that the accompanying figures illustrate the various implementations described herein and are not meant to limit the scope of the various technologies described herein.

DETAILED DESCRIPTION

Figure 1:
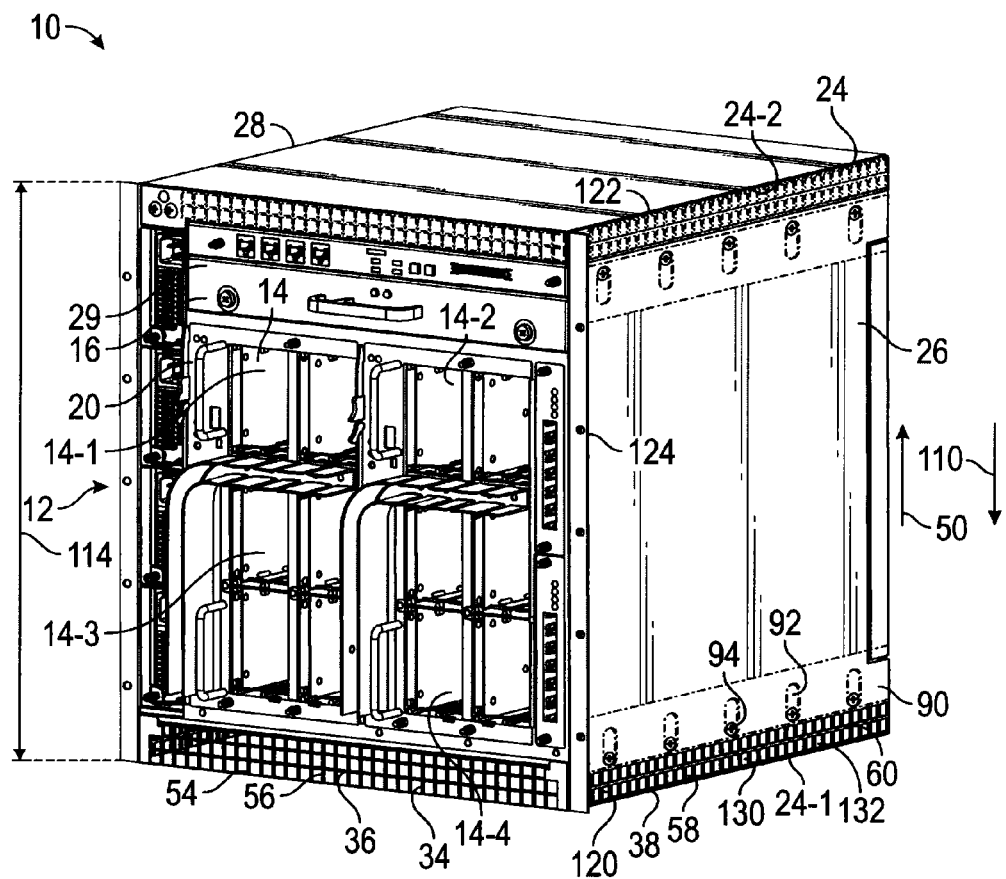
FIG. 1 is a front perspective view of a telecommunication equipment chassis constructed in accordance with the inventive concepts disclosed herein and configured to provide front and side to rear venting for telecommunication equipment supported within the telecommunication equipment chassis.

The following detailed description refers to the accompanying drawings. The same reference numbers in different drawings may identify the same or similar elements.

The mechanisms proposed in this disclosure circumvent the problems described above. Conventionally, various cooling systems have been deployed to control the temperature of the equipment, such as hot aisle and cold aisle strategies as well as hot aisle containment and cold aisle containment. In such hot aisle containment and cold aisle containment situations, front to rear venting is essential. In open rack situations, on the other hand, front to rear venting is not as important and side venting can be deployed. Chassis are commonly provided with side venting, and if the user needs front to rear venting only, then a baffle is implemented to redirect airflow. However, implementing a baffle requires a change to the chassis width, which can conflict with some standard rack sizes or interfere with rack mount brackets. In accordance with the present disclosure, a telecommunication equipment chassis may be designed to support telecommunication equipment within a server rack (not shown). The telecommunication equipment chassis may be designed to be vertically adjustable, rather than horizontally adjustable, so that a venting arrangement for the telecommunication equipment can be modified without changing a width of the telecommunication equipment chassis. The statement "without changing a width of the telecommunication equipment chassis" can have some variation in the width due to normal tolerances of the equipment rack, the thicknesses of blocking plates, venting plates, and whether or not the blocking plates and venting plates are inset within the side panels of the telecommunication equipment chassis. In one embodiment, the statement "without changing a width of the telecommunication equipment chassis" includes a variation of plus or minus 0.09 inch. Furthermore, an amount of airflow in cubic feet per meters (CFM) through the telecommunication equipment may not be affected when vertically adjusting the telecommunication equipment chassis because of unique venting configurations available in this disclosure. As such, a user may vertically adjust the telecommunication equipment chassis by 2 rack units (RU) (1.75 inches per RU) while still achieving the same desirable amount of airflow through the telecommunication equipment supported in the telecommunication equipment chassis. For example, a telecommunication equipment chassis may be 14 RUs in height and, the telecommunication equipment supported in the telecommunication equipment chassis may receive 600 CFM of airflow via front to rear venting only. However, where conserving vertical space is more important than front to rear venting, the telecommunication equipment chassis height may be decreased by 2 RUs while still providing the telecommunication equipment with 600 CFM of airflow because of the unique side venting deployed in this shorter telecommunication equipment chassis configuration—for example, 300 CFM of airflow via front to rear venting and 300 CFM via side venting. In this way, the telecommunication equipment chassis disclosed herein may offer a customer with one customizable telecommunication equipment chassis that can be reconfigured according to the customer's venting and vertical space needs and without affecting the width of the telecommunication equipment chassis.

Specific embodiments of the inventive concepts disclosed herein will now be described in detail with reference to the accompanying drawings. Further, in the following detailed description of embodiments of the present disclosure, numerous specific details are set forth in order to provide a more thorough understanding of the disclosure. However, it will be apparent to one of ordinary skill in the art that the embodiments disclosed herein may be practiced without these specific details. In other instances, well-known features have not been described in detail to avoid unnecessarily complicating the description.

Unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or at least one and the singular also includes the plural unless otherwise stated.

The terminology and phraseology used herein is for descriptive purposes and should not be construed as limiting in scope. Language such as "including," "comprising," "having," "containing," or "involving," and variations thereof, is intended to be broad and encompass the subject matter listed thereafter, equivalents, and additional subject matter not recited or inherently present therein.

As used herein any references to "one embodiment," "an embodiment," or "some embodiments" means that a particular element, feature, structure, or characteristic described in connection with the embodiment is included in at least one embodiment. The appearances of the phrase "in one embodiment" in various places in the specification may not refer to the same embodiment.

Referring now to the drawings, and in particular to FIG. 1, shown therein and designated by reference numeral 10 is a telecommunication assembly constructed in accordance with the present invention. In general, the telecommunication assembly 10 is provided with a telecommunication equipment chassis 12, one or more pieces of telecommunication equipment 14, and one or more fan units 16. The telecommunication equipment chassis 12 may be designed for mounting within a telecommunication rack (not shown) and may be adjustable to permit venting within the telecommunication equipment chassis 12 to occur from a front to rear arrangement, a side to side arrangement, or a combination of front and side to rear arrangement and preferably without changing a width of the telecommunication equipment chassis 12. By permitting adjustment of the venting throughout the telecommunication equipment chassis 12 without changing the width of the telecommunication equipment chassis 12, the telecommunication equipment chassis 12 solves the aforementioned problems with respect to having to add baffles to the prior telecommunication equipment chassis when trying to establish a front to rear venting arrangement.

As will be described in more detail below, the telecommunication equipment chassis 12 surrounds and encompasses an equipment bay 20 that is sized and adapted to receive the one or more pieces of telecommunication equipment 14 and the one or more fan unit 16. In the example shown in FIG. 1, four pieces of telecommunication equipment 14 are disposed within the equipment bay 20 and numbered with reference numerals 14-1, 14-2, 14-3, and 14-4 for purposes of clarity. In the example shown, the telecommunication equipment 14-1, 14-2, 14-3, and 14-4 are optical switches, but other types of telecommunication equipment, such as line cards, computer servers and the like can be positioned in the equipment bay 20. One skilled in the art would recognize that more or less than four pieces of telecommunication equipment 14 can be positioned within the equipment bay 20. As discussed above, the one or more fan unit 16 is also disposed within the equipment bay 20. In the example shown in FIGS. 1 and 2, only one fan unit 16 is positioned within the equipment bay 20 generally near an upper end of the telecommunication equipment chassis 12. As will be discussed in more detail below, the fan unit 16 is positioned within the equipment bay 20 and draws air into the telecommunication equipment chassis 12 from outside of the telecommunication equipment chassis 12 through openings formed within the telecommunication equipment chassis 12, through the pieces of telecommunication equipment 14 and ejects the air outside of the telecommunication equipment chassis 12.

The telecommunication equipment chassis 12 is provided with one or more tray 24, a first side panel 26, and a second side panel 28. The fan unit 16 may be secured to at least one of the first and second side panels 26 and 28. The fan unit 16 is provided with an enclosure 29 having an inlet (not shown) and an outlet 29-1, and a fan 30 (shown in FIG. 2) within the enclosure 29 and is configured to move air from the inlet to the outlet 29-1. The inlet is positioned within the equipment bay 20 and in communication with at least one air channel of the piece of telecommunication equipment 14.

In the example shown, the telecommunication equipment chassis 12 is provided with two trays 24 with one of the trays forming a bottom of the telecommunication equipment chassis 12 and being designated by reference numeral 24-1, and another one of the trays 24 forming a top of the telecommunication equipment chassis 12 and being designated by reference numeral 24-2. The first side panel 26 is adjustably connected to the tray 24-1 and the tray 24-2 so as to permit vertical adjustment of the trays 24-1 and 24-2 relative to the first side panel 26. The second side panel 28 is adjustably connected to the tray 24-1 and the tray 24-2 permit vertical adjustment of the trays 24-1 and 24-2 relative to the second side panel 28. The vertical adjustment of the trays 24-1 and/or 24-2 relative to the first and second side panels 26 and 28 permits modification of venting zones in the front and/or sides of the telecommunication equipment chassis 12. Thus, the size and/or arrangement of the venting zone(s) may be at least partially a function of a relative location of the first side panel 26 and the second side panel 28 relative to the trays 24-1 and 24-2. The trays 24, the first side panel 26 and the second side panel 28 can be constructed of any suitable material, such as cold rolled steel, plastic, aluminum or stainless steel. The material forming the trays 24, the first side panel 26 and the second side panel may have a thickness between 0.05 inches and 0.06 inches, but other thicknesses of material can be used.

In general, the trays 24-1 and 24-2 may be substantially similar in construction and function except that the tray 24-2 may not have a rear wall (such as rear wall 96 shown in FIGS. 2, 3, and 6 and described below) in those instances where the fan unit 16 is adjacent to the tray 24-2. In such instances, the tray 24-2 is devoid of a rear wall that would otherwise prevent air from ejecting at the top rear of the telecommunication equipment chassis 12. In such instances, a venting plate (such as venting plate 140-2 shown in FIG. 6 and described below) may be used to fill the void left by the absence of a rear wall. For purposes of brevity, only a detailed description with respect to the tray 24-1 will be discussed herein. However, it should be understood that the discussion with respect to the tray 24-1 is equally applicable to the tray 24-2 except for the instance noted above.

Figure 3:
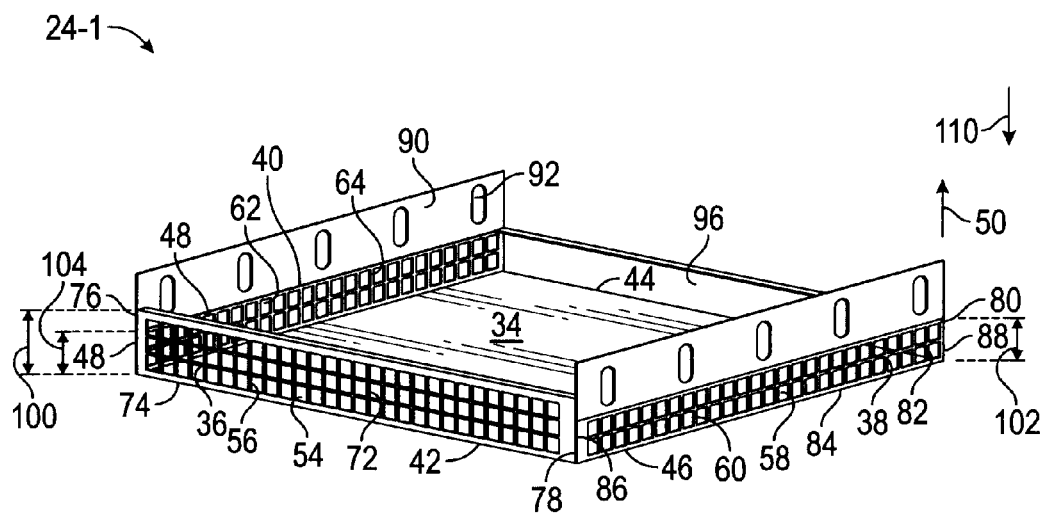
FIG. 3 is a front perspective view of a tray constructed in accordance with the inventive concepts disclosed herein.

Referring to FIGS. 1 and 3, the tray 24-1 forms the bottom of the telecommunication equipment chassis 12. The tray 24-1 is provided with an end wall 34, a front wall 36, a first side wall 38, and a second side wall 40. The end wall 34 has a first end 42, a second end 44, a first side 46, and a second side 48. Preferably, the end wall 34 is constructed of a continuous material that is substantially devoid of any openings intended to provide a vent into the equipment bay 20, but may include one or more openings (not shown) intended for other purposes, including the receipt of a screw for connecting the end wall 34 to another device. The front wall 36 may have a height that is a multiple of a rack unit, i.e., 1.75 inches. In the example shown, the front wall 36 has a height of 1.75 inches. In some embodiments, the first and second side walls 38 and 40 may have a height of at least two rack units, i.e., 3.50 inches.

The front wall 36 may be connected to and extend from the first end 42 of the end wall 34 in a first direction 50 (which in this example is in an upward direction) generally perpendicular to the end wall 34. The first side wall 38 of the tray 24-1 may be connected to and extend from the first side 46 of the end wall 34 in the first direction 50 generally perpendicular to the end wall 34. The second side wall 40 may be connected to and extend from the second side 48 of the end wall 34 in the first direction 50 generally perpendicular to the end wall 34.

The front wall 36 may have a plurality of first openings 54 which cooperate to define a first venting zone 56. The first side wall 38 may have a second plurality of openings 58 which cooperate to define a second venting zone 60. The second side wall 40 may have a third plurality of openings 62 which cooperate to define a third venting zone 64. The first, second and third openings 54, 58, and 62 of the first, second and third venting zones 56, 60, and 64 are sized and adapted to permit air to be drawn into the equipment bay 20 of the telecommunication equipment chassis 12 for cooling the telecommunication equipment 14.

The front wall 36 has a perimeter 70 surrounding an area 72. As shown in FIG. 3, the first openings 54 are arranged within a pattern within the first venting zone 56 so that the pattern spans at least 90% of the area 72. The pattern which is depicted within the figures is a grid-like pattern having three rows of polygonally shaped openings; however, it should be understood that other patterns can be used. For example, the first openings 54 can be arranged in a non-grid-like pattern such as a fanciful pattern or a random pattern as desired by the designer of the tray 24-1.

The front wall 36 has an outer edge 74 which is positioned adjacent to the end wall 34. The first openings 54 can be arranged within the pattern within the first venting zone 56 adjacent to the outer edge 74. The front wall 36 also has a first side 76 and a second side 78 which is opposite from the first side 76. The first openings 54 can be arranged within the pattern such that the first openings 54 extend from the first side 76 to the second side 78 as shown in FIGS. 1 and 3.

The first side wall 38 and the second side wall 40 of the tray 24-1 may be substantially identical in construction and function. For purposes of brevity, only the first side wall 38 of the tray 24-1 will be discussed hereinafter. However, it should be understood that such description is equally applicable to the second side wall 40 of the tray 24-1.

The first side wall 38 of the tray 24-1 has a perimeter 80 surrounding an area 82. The second openings 58 may be arranged within a pattern within the second venting zone 60 so that the pattern spans at least 90% of the area 82. The first side wall 38 may also have an outer edge 84 positioned adjacent to the end wall 34. The second openings 58 may be arranged within a pattern within the second venting zone 60 adjacent to the outer edge 84. The first side wall 38 may also have a first side 86 and a second side 88 generally opposite to the first side 86. The second openings 58 may be arranged within a pattern extending from the first side 86 to the second side 88 as shown in FIGS. 1 and 3. The pattern which is depicted within the figures is a grid-like pattern having two rows of polygonally shaped openings; however, it should be understood that other patterns can be used. For example, the second openings 58 can be arranged in a non-grid-like pattern such as a fanciful pattern or a random pattern as desired by the designer of the tray 24-1.

The first side wall 38 may also be provided with a blocking zone 90 having a substantially continuous material so as to prevent the movement of air through the blocking zone 90. The blocking zone 90 is shown in phantom within FIGS. 1 and 2. The blocking zone 90 may extend from the second venting zone 60 in the first direction 50 as shown in FIG. 3. In some embodiments, the blocking zone 90 may have a height of 1.75 inches. In some embodiments, the first side wall 38 may also be provided with a plurality of slots 92 extending vertically to permit adjustment of the first side panel 26 relative to the tray 24-1. However, other manners of providing vertical adjustment can be used, such as a series of vertically positioned screw holes, or a separate mechanism, such as a rack and pinion assembly. The plurality of slots 92 are shown in phantom in FIGS. 1, 2, and 5. Each of the slots 92 is sized and configured to receive a screw 94 for adjustably connecting the first side panel 26 to the first side wall 38 as shown in FIG. 1. In the example depicted in FIGS. 1 and 3, the first side wall 38 is provided with 5 slots 92; however, more or less slots 92 can be used so long as the slots 92 are sufficient in size and dimension to permit adjustment of a vertical position of the screws 94 within the slots 92 while also maintaining sufficient strength to secure the first side panel 26 to the first side wall 38. In some embodiments, the slots 92 have a length, which is a multiple of a rack unit, i.e., 1.75 inches. For example, in the example shown, the slots 92 have a length of 1.75 inches, i.e., one rack unit.

The tray 24-1 may also be provided with a rear wall 96 extending from the second end 44 of the end wall 34 in the first direction 50 and generally perpendicular to the end wall 34. Preferably, the rear wall 96 is substantially devoid of any openings intended to provide a vent into the equipment bay 20 of the telecommunication equipment chassis 12 so that air is directed into the first, second and third openings 54, 58 and 62 of the first, second and third venting zones 56, 60, and 64.

As shown in FIG. 1, the first venting zone 56 is provided on a front of the telecommunication equipment chassis 12 while the second and third venting zones 60 and 64 are provided on the side of the telecommunication equipment chassis 12. In this configuration, the first, second and third venting openings 54, 58 and 62 of the first, second and third venting zones 56, 60, and 64 are unobstructed such that air is drawn by the fan unit 16 through the first, second and third openings 54, 58 and 62 and through the pieces of telecommunication equipment 14. The first venting zone 56 is provided with a first height 100, the second venting zone 60 is provided with a second height 102, and the third venting zone 64 is provided with a third height 104. When the tray 24-1 is configured to provide an adjustment of 1 rack unit, in some embodiments, the first height 100 may be 1.5 inches, the second height 102 may be in a range from 1.0-1.5 inches, and the third height 104 may be in a range from 1.0-1.5 inches. In the example shown, the first height 100 is greater than the second height 102 and the third height 104 so as to establish a greater amount of airflow through the first venting zone 56 relative to the second venting zone 60 and the third venting zone 64. However, it should be understood that in other embodiments the first height 100 may be the same as or even less than the second height 102 and the third height 104, depending upon where the designer would prefer to permit the greater amount of airflow.

The first side panel 26 and the second side panel 28 may be substantially identical in construction and function. For purposes of brevity, only the first side panel 26 of the tray 24-1 will be discussed hereinafter. However, it should be understood that such description is equally applicable to the second side panel 28.

Figure 2:
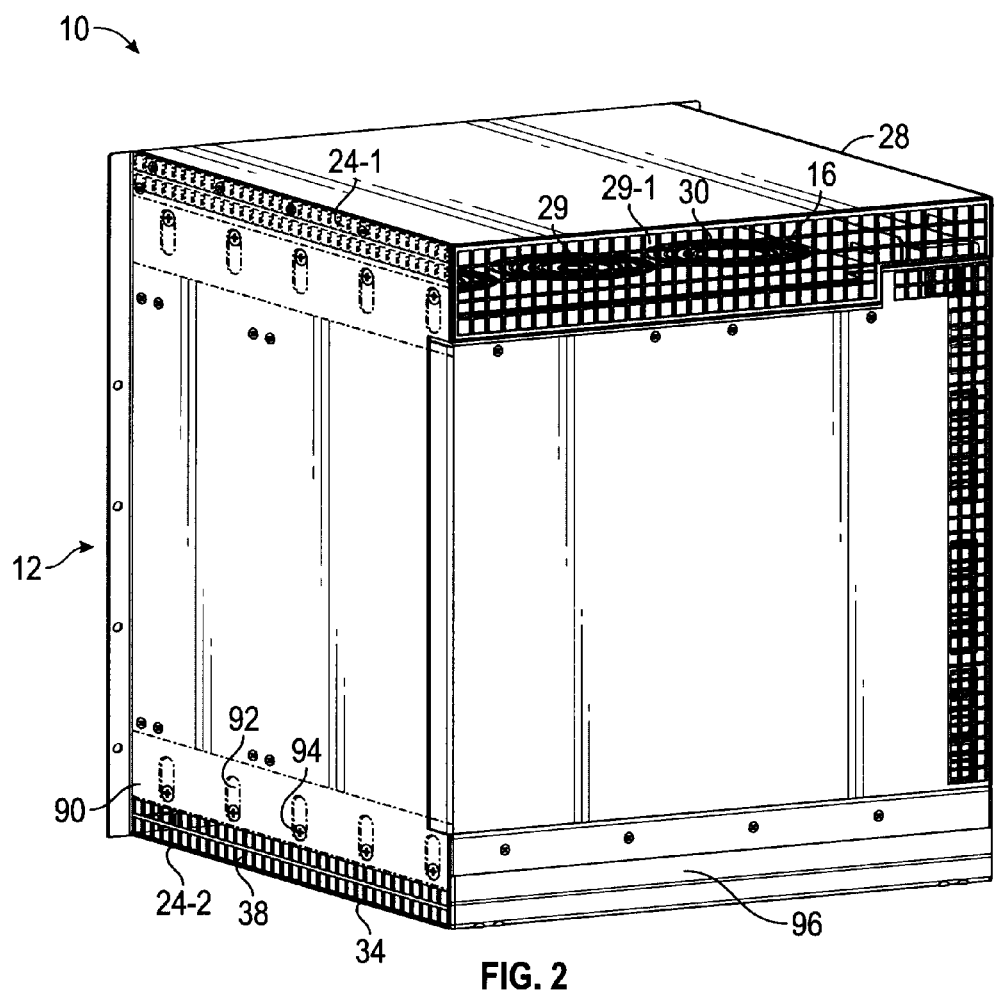
FIG. 2 is a rear perspective view of the telecommunication equipment chassis of FIG. 1.
Figure 4:
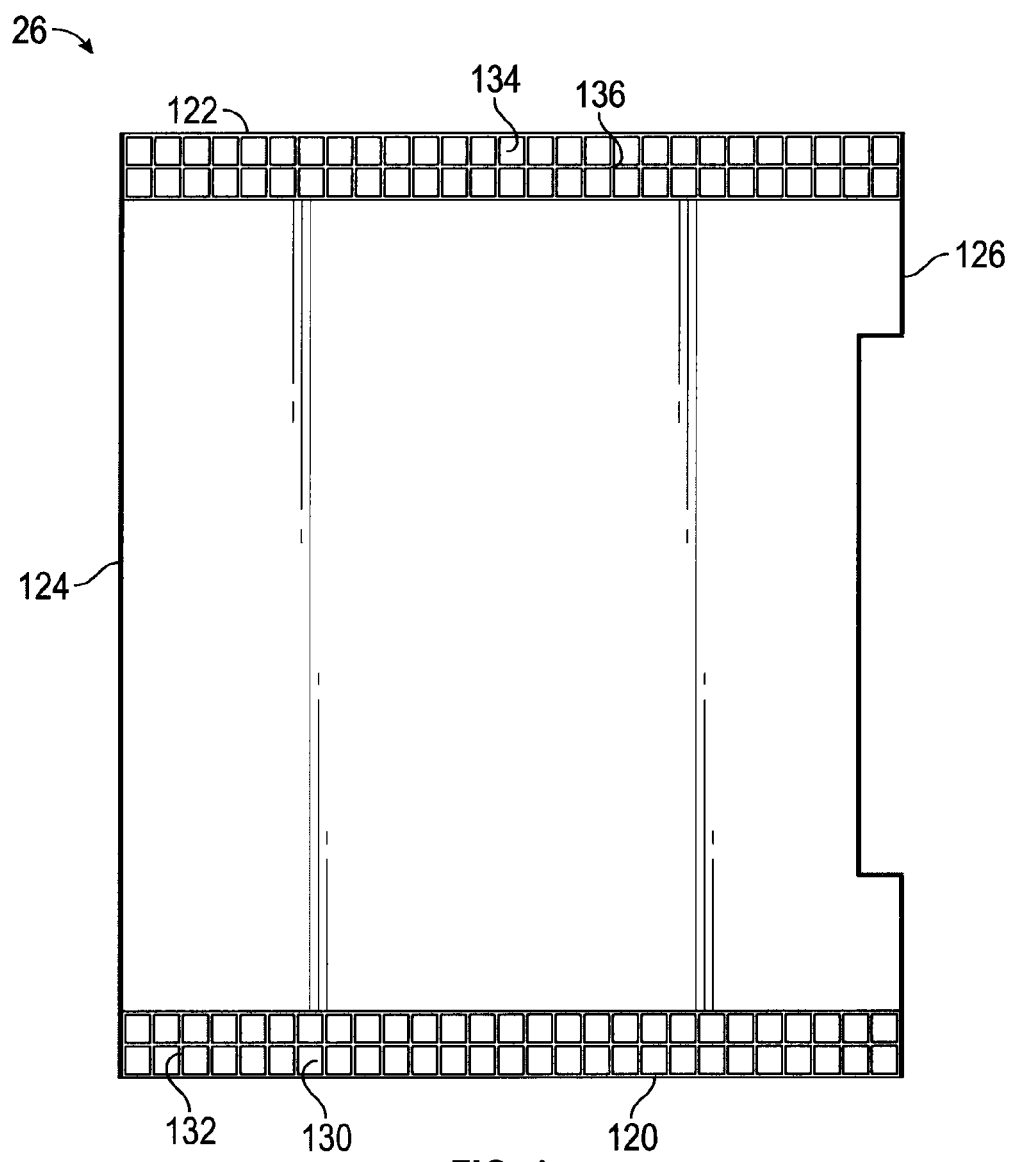
FIG. 4 is side elevation view of side panel constructed in accordance with the inventive concepts disclosed herein.
Figure 5:
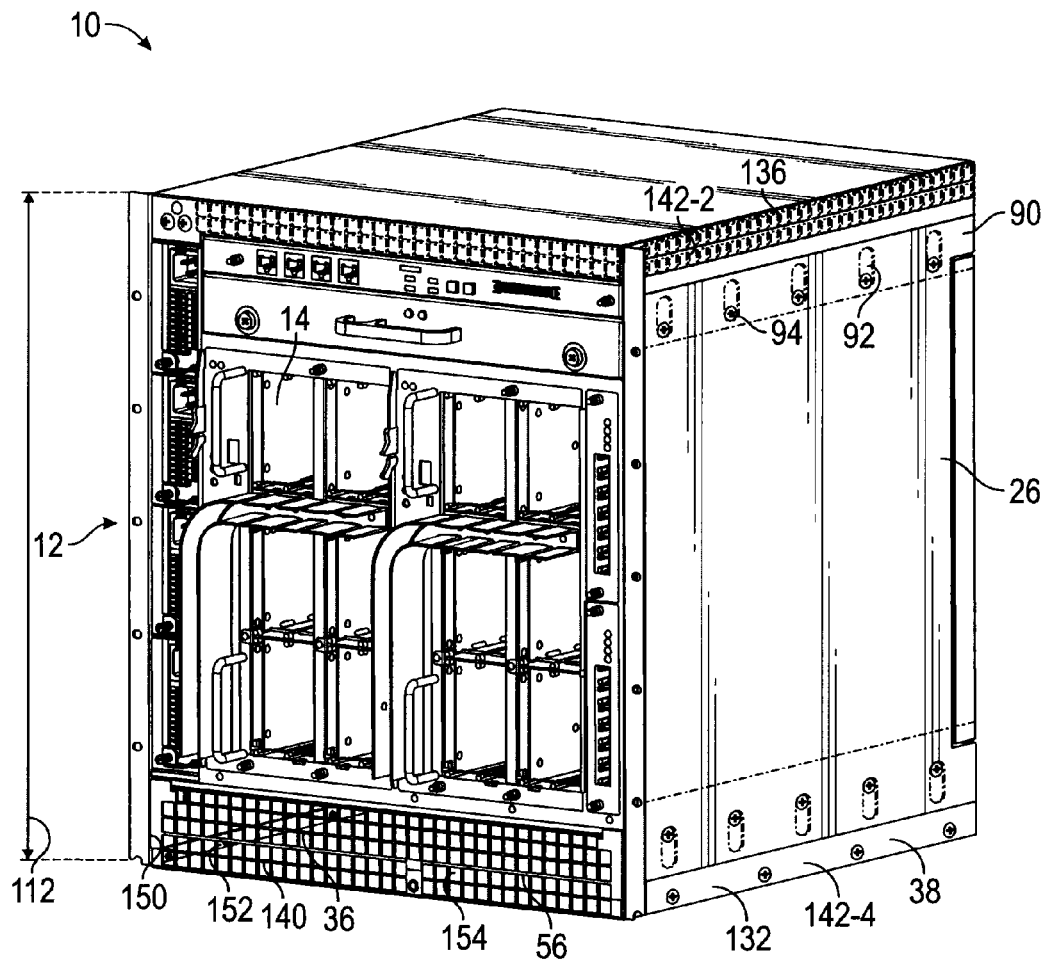
FIG. 5 is a front perspective view of another version of a chassis constructed in accordance with the inventive concepts disclosed herein and configured to provide front to rear venting for telecommunication equipment supported within the telecommunication equipment chassis.

The first side panel 26 is shown in FIGS. 1, 2, and 4. As discussed above, the first side panel 26 is adjustably connected to the first side wall 38 to permit movement in the first direction 50 and a second direction 110 which changes the manner in which there is vented through the telecommunication equipment chassis 12. In particular, the first side panel 26 is movable between a first position which is shown in FIG. 5 and a second position which is shown in FIG. 1. The telecommunication equipment chassis 12 has a height 112 in the first position, and a height 114 in the second position. In the example shown, the height 112 when the first side panel 26 is in the first position is greater than the height 114 when the first side panel 26 is in the second position.

The first side panel 26 has a first end 120, a second end 122, a first side 124 (that is adjacent to a front of the telecommunication equipment chassis 12) and a second side 126 (that is adjacent to a rear of the telecommunication equipment chassis 12). The first end 120 is adjacent to a bottom of the telecommunication equipment chassis 12, and the second end 122 is adjacent to a top of the telecommunication equipment chassis 12. The first side panel 26 is also provided with a plurality of first openings 130 that are positioned adjacent to the first end 120 and define a first side venting zone 132, and a plurality of second openings 134 that are positioned adjacent to the second end 122 and define a second side venting zone 136. As shown in FIG. 1, the first side venting zone 132 of the first side panel 26 overlaps the second venting zone 60 such that the second openings 58 in the first side wall 38 and the first openings 130 in the first side panel 26 are aligned to permit air to flow into the equipment bay 20.

Outside of the first side venting zone 132 and the second side venting zone 136, the first side panel 26 may be constructed of a substantially continuous material which is devoid of any openings intended to provide a vent into the equipment bay. However, it should be understood that the first side panel 26 can be provided with a variety of openings utilized to receive screws for connecting the first side panel 26 to the tray 24-1 and/or the tray 24-2 as well as connecting the first side panel 26 to the telecommunication equipment 14 and/or the fan unit 16, or other devices.

When the first side panel 26 is in the first position and the height 112 is greater than the height 114, as shown in FIG. 5, the telecommunication equipment chassis 12 may be configured for solely front to rear venting, meaning that air is drawn into the equipment bay 20 from a front of the telecommunication equipment chassis 12 and ejected out a rear of the telecommunication equipment chassis 12. In the first position, it may be desirable to prevent any airflow from passing through the first side wall 38 and the second side wall 40 of the tray 24-1, as well as to supplement the airflow that is provided through the front wall 36 of the tray 24-1.

Figure 6:
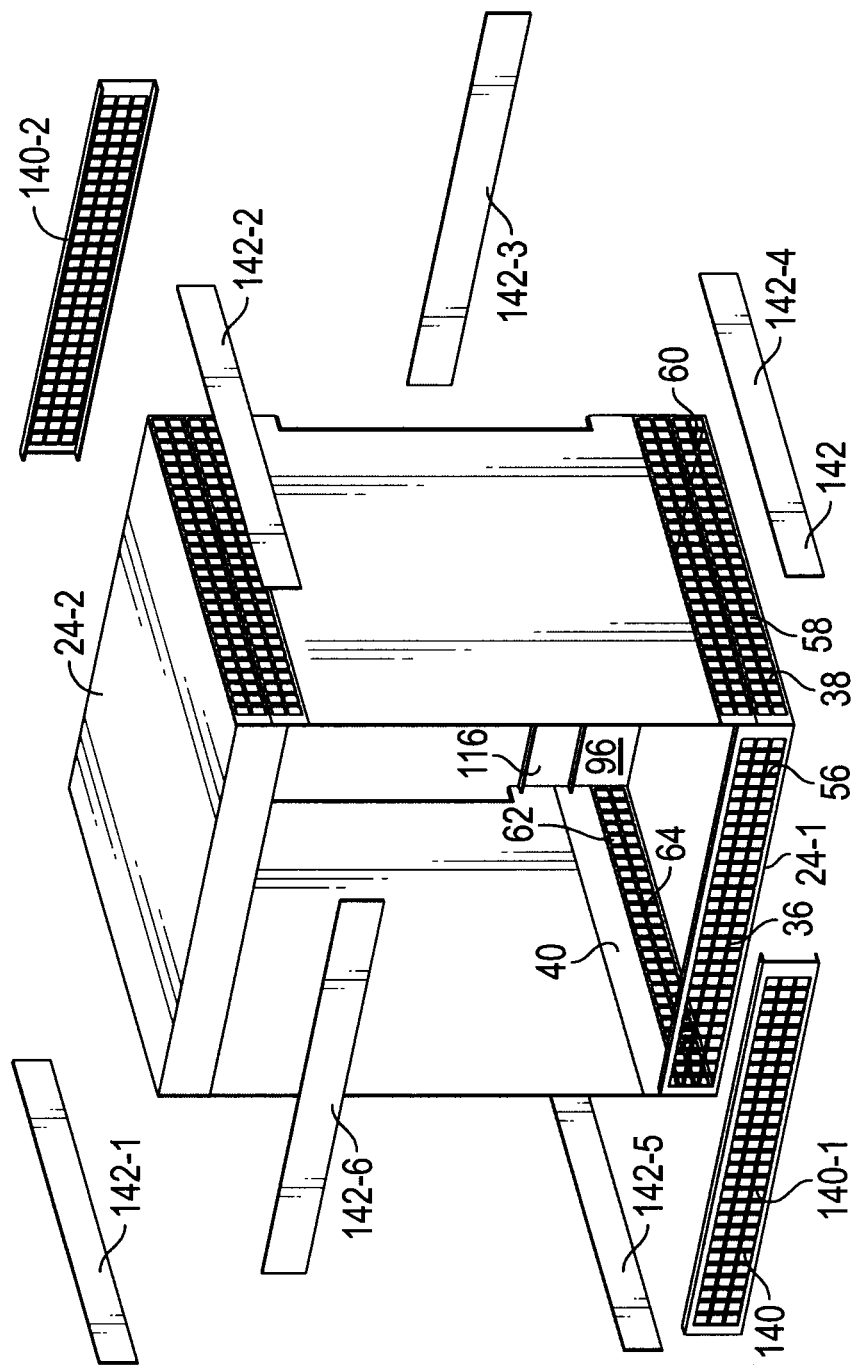
FIG. 6 is a front perspective exploded view of the telecommunication equipment chassis of FIG. 5.

To direct the airflow for a solely front to rear venting arrangement, the telecommunication equipment chassis 12 may be provided with one or more venting plates 140 and/or blocking plates 142 as shown in FIGS. 5 and 6. In the example depicted in FIG. 6, the telecommunication equipment chassis 12 may be provided with two venting plates 140 which are identified by way of example with the reference numerals 140-1 and 140-2. The telecommunication equipment chassis 12 may also be provided with six blocking plates 142 which are identified by way of example with reference numerals 142-1, 142-2, 142-3, 142-4, 142-5, and 142-6.

One of the venting plates 140 is shown in FIG. 5. The venting plate 140 has a perimeter 150 surrounding an area 152. The venting plate 140 is also provided with a plurality of openings 154 that are arranged within a pattern within the perimeter 150 so that the pattern and the openings 154 span at least 90% of the area 152. The pattern, which is depicted within FIG. 5 is a grid-like pattern having three rows of polygonally shaped openings; however, it should be understood that other patterns can be used. For example, the openings 154 can be arranged in a non-grid-like pattern such as a fanciful pattern or a random pattern as desired by the designer of the venting plate 140. In the example shown, the venting plate 140 is positioned adjacent to the front wall 36 so as to provide a substantially continuous venting zone formed by combination of the venting plate 140 and the front wall 36. In one embodiment, the venting plate 140 can be positioned so as to overlap a portion of the front wall 36 is depicted within FIG. 5. However, it should be understood that other configurations are possible, such as the front wall 36 overlapping a portion of the venting plate 140.

Some of the blocking plates 142 are depicted in FIG. 5, namely blocking plates 142-2 and 142-4. In general, the blocking plate 142 may be provided with a substantially continuous material that is devoid of any openings which are intended to be used for a venting purpose. The blocking plate 142 may, however, be provided with various openings and/or apertures for receiving a screw for connecting the blocking plate 142 to portions of the telecommunication equipment chassis 12, such as the first side panel 26 is depicted in FIG. 5. One of the blocking plates 142, such as blocking plate 142-4 (shown in FIGS. 5 and 6), may be positioned over the first side wall 38 so as to block any airflow which may occur through the second openings 58, and another one of the blocking plates 142, such as blocking plate 142-5 (shown in FIG. 6) may be positioned over the second side wall 42 to block any airflow which may occur through the third openings 62.

As shown in FIG. 6, blocking plate 142-1 may be positioned over a third venting zone of a second side wall of tray 24-2 to prevent side venting. Blocking plate 142-2 may be positioned over a second venting zone of a first side wall of tray 24-2 to prevent side venting. Blocking plate 142-3 may be positioned over an open space 116 adjacent to the rear wall 96 (also shown in FIG. 2) to prevent air from entering the bottom rear of the telecommunication chassis 12. Blocking plate 142-4 may be positioned over the second venting zone 60 of the first side wall 38 and the tray 24-1 to prevent side venting. Blocking plate 142-5 may be positioned over the third venting zone 64 of the second side wall 40 of tray 24-1 to prevent side venting; and blocking plate 142-6 may be positioned over a first venting zone of a front wall of tray 24-2 to prevent air from entering or exiting the telecommunication equipment chassis 12 at the top of the same. Venting plate 140-1 may be positioned adjacent to and overlapping with the first venting zone 56 of the front wall 36 of tray 24-1 to allow air to be drawn in the bottom front of the telecommunication equipment chassis 12; and venting plate 140-2 may be positioned over a rear wall of tray 24-2 to allow air to exit through the top rear of the telecommunication equipment chassis 12 and to fill a void that would otherwise be left by the absence of a rear wall on tray 24-2.

If the user desires front to rear venting only, then the configuration of telecommunication equipment chassis 12 and accompanying venting plates 140 and blocking plates 142 as shown in FIGS. 5 and 6 (and described immediately above) may be deployed. This way, air may be drawn in the bottom front of the telecommunication equipment chassis 12, through the telecommunication equipment 14, and exit the top rear of the telecommunication equipment chassis 12. If the user desires side to side venting, then a modification of the configuration of telecommunication equipment chassis 12 as shown in FIGS. 1 and 2 may be deployed by adding and positioning a blocking plate (not shown) over the first venting zone 56 of the front wall 36 of the tray 24-1. This way, air will be drawn in the bottom sides of the telecommunication equipment chassis 12, through the telecommunication equipment 14, and exit the top rear of the telecommunication equipment chassis 12.If the user desires a combination of front and side to rear venting, then the configuration of the telecommunication equipment chassis 12 as shown in FIGS. 1 and 2 may be deployed. This way, air may be drawn in the bottom front and bottom sides of the telecommunication equipment chassis 12, through the telecommunication equipment 14, and exit the top rear of the telecommunication equipment chassis 12. These various venting systems may be achieved by modifying the height of the telecommunication equipment chassis 12 (along with applying various combinations of venting and blocking plates) and without modifying the width of the telecommunication equipment chassis 12.

CONCLUSION

Conventionally, various cooling systems have been deployed to control the temperature of the equipment, such as hot aisle and cold aisle strategies as well as hot aisle containment and cold aisle containment. In such hot aisle containment and cold aisle containment situations, front to rear venting is essential. In open rack situations, on the other hand, front to rear venting is not as important and side venting can be deployed. Chassis are commonly provided with side venting, and if the user needs front to rear venting only, then a baffle is implemented to redirect airflow. However, implementing a baffle requires a change to the chassis width, which can conflict with some standard rack sizes or interfere with rack mount brackets. In accordance with the present disclosure, the telecommunication equipment chassis 12 may be designed to support the telecommunication equipment 14 within a server rack (not shown) and which is vertically adjustable, rather than horizontally adjustable, so that the venting arrangement for the telecommunication equipment 14 can be modified without changing a width of the telecommunication equipment chassis 12.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Further, while implementations have been described in the context of supporting telecommunication equipment 14, this need not be the case. These implementations may apply to supporting any type of electronic and/or optical equipment within a server rack, such as computer servers, power supplies, communication equipment or the like.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred embodiment. Further, the phrase "based on" is intended to mean "based, at least in part, on" unless explicitly stated otherwise.

What is claimed is:

1. A telecommunication equipment chassis, comprising: a tray having an end wall, a front wall, a first side wall, and a second side wall, the end wall having a first end, a second end, a first side, and a second side, the front wall extending from the first end of the end wall in a first direction, the first side wall extending from the first side of the end wall in the first direction, the second side wall extending from the second side of the end wall in the first direction, the front wall having a plurality of first openings defining a first venting zone to pass a first airflow, the first side wall having a plurality of second openings defining a second venting zone to pass a second airflow, the second side wall having a plurality of third openings defining a third venting zone to pass a third airflow;

a first side panel adjustably connected to the first side wall to permit movement of the first side panel relative to the tray in the first direction to a first position, and movement of the first side panel relative to the tray in a second direction opposite to the first direction to a second position, the first side panel having a plurality of first side panel openings defining a first side venting zone, wherein the first side venting zone overlaps the second venting zone in the second position such that the plurality of second openings in the first side wall and the plurality of first side panel openings in the first side panel are aligned when the first side panel is secured to the first side wall in the second position relative to the tray;

a second side panel adjustably connected to the second side wall to permit movement of the second side panel relative to the tray in the first direction to the first position, and movement of the second side panel relative to the tray in the second direction to the second position, the second side panel having a plurality of second side panel openings defining a second side venting zone, wherein the second side venting zone overlaps the third venting zone in the second position such that the plurality third of openings in the second side wall and the plurality of second side panel openings in the second side panel are aligned when the second side panel is secured to the second side wall in the second position relative to the tray, the first side panel and the second side panel cooperating to at least partially define an equipment bay that is sized and configured to receive at least one piece of telecommunication equipment; and a blocking plate overlapping and extending along the plurality of second openings in the second venting zone when the first side panel is in the first position or the second position, the blocking plate having a continuous material so as to seal at least a portion of the plurality of second openings in the second venting zone.

2. The telecommunication equipment chassis of claim 1, wherein the front wall has a perimeter surrounding an area, and wherein the first openings are arranged within a pattern within the first venting zone so that the pattern spans at least 90% of the area.

3. The telecommunication equipment chassis of claim 1, wherein the front wall has an outer edge positioned adjacent to the end wall, and wherein the first openings are arranged within a pattern within the first venting zone adjacent to the outer edge.

4. The telecommunication equipment chassis of claim 1, wherein the front wall has a first side and an opposed second side, and wherein the first openings are arranged within a pattern extending from the first side to the second side.

5. The telecommunication equipment chassis of claim 1, wherein the first side wall of the tray has a perimeter surrounding an area, and wherein the second openings are arranged within a pattern within the second venting zone so that the pattern spans at least 90% of the area.

6. The telecommunication equipment chassis of claim 1, wherein the first side wall has an outer edge positioned adjacent to the end wall, and wherein the second openings are arranged within a pattern within the second venting zone adjacent to the outer edge.

7. The telecommunication equipment chassis of claim 1, wherein the first side wall has a first side and an opposed second side, and wherein the second openings are arranged within a pattern extending from the first side to the second side.

8. The telecommunication equipment chassis of claim 1, wherein the first side wall further comprises a blocking zone having a continuous material so as to prevent the movement of air through the blocking zone, the blocking zone extending from the second venting zone in the first direction.

9. The telecommunication equipment chassis of claim 8, wherein the blocking zone has a plurality of slots sized and configured to receive a plurality of screws for adjustably connecting the first side panel to the first side wall.

10. The telecommunication equipment chassis of claim 1, wherein the tray further comprises a rear wall extending from the second end of the tray in the first direction.

11. The telecommunication equipment chassis of claim 1, wherein the blocking plate is attached to the first side panel by a plurality of plurality of screws.

12. The telecommunication equipment chassis of claim 1, further comprising: a blocking plate overlapping the third venting zone of the second side wall of the tray when the second side panel is in the first position or the second position, the blocking plate having a continuous material so as to seal at least a portion of the third plurality of openings in the third venting zone.

13. The telecommunication equipment chassis of claim 1, further comprising: a venting plate having a plurality of fourth openings defining a fourth venting zone, the venting plate being at least one of contiguous or overlapping the front wall of the tray when the first side panel is in the first position and when the second side panel is in the first position.

14. A telecommunication assembly, comprising:
a telecommunication equipment chassis, comprising:
a tray having an end wall, the end wall being either a top or a bottom of the telecommunication equipment chassis;
a first side panel movable relative to the tray, such that the first side panel is selectively secured at one of a plurality of first locations relative to the tray;
a second side panel movable relative to the tray, such that the second side panel is selectively secured at one of a plurality of second locations relative to the tray;
a piece of telecommunication equipment positioned within an equipment bay and secured to at least one of the first or second side panels, the piece of telecommunication equipment having at least one air channel positioned to receive air from at least one venting zone having at least one opening, the at least one venting zone at least partially surrounded by at least one of the tray, the first side panel or the second side panel, a size of the at least one venting zone being a function of said one of the plurality of first locations at which the first side panel is secured to the tray and said one of the plurality of second locations at which the second side panel is secured to the tray;
a fan unit positioned within the equipment bay and secured to at least one of the first and second side panels, the fan unit provided with an enclosure having an inlet and an outlet, and a fan within the enclosure and configured to move the air from the inlet to the outlet, the inlet being positioned within the equipment bay and in communication with the at least one air channel of the piece of telecommunication equipment; and
a blocking plate overlapping and extending along the at least one venting zone, the blocking plate having a continuous material so as to seal at least a portion of the at least one venting zone.

15. The telecommunication assembly of claim 14, wherein the at least one venting zone extends between the first side panel and the second side panel.

16. The telecommunication assembly of claim 14, wherein the first side panel includes a front edge and a back edge, and wherein the at least one venting zone extends between the front edge and the back edge of the first side panel.

17. The telecommunication assembly of claim 14, wherein the tray has a front wall having a perimeter surrounding an area, and wherein the at least one opening is a plurality of openings, the plurality of openings are arranged within a pattern within the at least one venting zone so that the pattern spans at least 90% of the area.

18. The telecommunication assembly of claim 14, wherein the tray has a front wall having an outer edge positioned adjacent to the end wall, and wherein the at least one opening is a plurality of openings, the plurality of openings are arranged within a pattern within the at least one venting zone adjacent to the outer edge.

19. The telecommunication assembly of claim 18, wherein the front wall has a first side and an opposed second side, and wherein the plurality of openings are arranged within the pattern extending from the first side to the second side.

20. The telecommunication assembly of claim 14, wherein the tray has a front wall having a first side and an opposed second side, and wherein the at least one opening is a plurality of openings, the plurality of openings are arranged within a pattern within the at least one venting zone extending from the first side to the second side.

* * * * *